United States Patent
Pharn et al.

(10) Patent No.: US 7,106,071 B2
(45) Date of Patent: Sep. 12, 2006

(54) CABLE DIAGNOSTICS USING TIME DOMAIN REFLECTOMETRY AND APPLICATIONS USING THE SAME

(75) Inventors: Art Pharn, Huntington Beach, CA (US); Peiqing Wang, Irvine, CA (US); Siavash Fallahi, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 7 days.

(21) Appl. No.: 10/855,622

(22) Filed: May 28, 2004

(65) Prior Publication Data

US 2004/0251913 A1    Dec. 16, 2004

Related U.S. Application Data

(60) Provisional application No. 60/477,397, filed on Jun. 11, 2003.

(51) Int. Cl.
*G01R 31/02* (2006.01)
*G01R 31/11* (2006.01)

(52) U.S. Cl. .................. 324/539; 324/533; 324/534

(58) Field of Classification Search .......... 324/539, 324/512, 500, 534, 537, 532, 533, 527, 522, 324/637, 642; 702/159; 73/620, 627
See application file for complete search history.

(56) References Cited

U.S. PATENT DOCUMENTS

| | | | | |
|---|---|---|---|---|
| 5,461,318 A | * | 10/1995 | Borchert et al. | 324/533 |
| 5,514,965 A | * | 5/1996 | Westwood | 324/533 |
| 5,521,512 A | * | 5/1996 | Hulina | 324/533 |
| 5,894,223 A | * | 4/1999 | Medelius et al. | 324/529 |
| 6,643,595 B1 | | 11/2003 | Rakshani et al. | |
| 6,653,844 B1 | * | 11/2003 | Wyar | 324/533 |
| 6,697,768 B1 | * | 2/2004 | Jones et al. | 702/189 |
| 6,822,457 B1 | * | 11/2004 | Borchert et al. | 324/512 |
| 6,825,672 B1 | * | 11/2004 | Lo et al. | 324/533 |
| 6,906,526 B1 | * | 6/2005 | Hart et al. | 324/527 |
| 6,917,888 B1 | * | 7/2005 | Logvinov et al. | 702/59 |
| 6,977,507 B1 | * | 12/2005 | Pannell et al. | 324/534 |
| 6,980,007 B1 | * | 12/2005 | Lo et al. | 324/543 |
| 7,002,353 B1 | * | 2/2006 | Lo et al. | 324/534 |
| 7,005,861 B1 | * | 2/2006 | Lo et al. | 324/533 |
| 2004/0046570 A1 | * | 3/2004 | Teich | 324/541 |
| 2004/0251912 A1 | | 12/2004 | Pharn et al. | |

* cited by examiner

*Primary Examiner*—Anjan Deb
*Assistant Examiner*—Hoai-An D. Nguyen
(74) *Attorney, Agent, or Firm*—Sterne, Kessler, Goldstein & Fox P.L.L.C.

(57) ABSTRACT

A system and method are used to determine connectivity and/or cable faults of a cable. A signal transmitting and receiving system is coupled to the cable. An analog-to-digital converter (ADC) coupled to the signal transmitting and receiving system. A TDR system coupled to the ADC and a memory, and a controlling system coupled to at least one of the ADC, the TDR system, and the signal receiving and transmitting system. The controlling system includes a controller and one or more state machines that are used to control the TDR system.

17 Claims, 7 Drawing Sheets

CABLE DIAGNOSTICS USING TIME DOMAIN REFLECTOMETRY AND APPLICATIONS USING THE SAME

CROSS REFERENCE TO RELATED APPLICATIONS

This application claims benefit under 35 U.S.C. § 119(e) to U.S. Prov. App. No. 60/477,397, filed Jun. 11, 2003, entitled "Cable Diagnostics Using Time Domain Reflectometry and Applications Using The Same," which is incorporated by reference herein in its entirety.

This application is related to co-pending application Ser. No. 10/855,621, filed concurrently herewith, which is incorporated by reference herein in its entirety.

BACKGROUND OF THE INVENTION

1. Field of the Invention

The present invention is related to time domain reflectometry and applications for using the same.

2. Background Art

Time Domain Reflectometry (TDR) can be used to determine characteristics (e.g., length, status (open or short), connectivity (connected or not connected, etc.) about a cable. Typically, in TDR a test pulse is sent into a cable and characteristics about the cable are determined through detection (or not detecting) a return signal (e.g., a reflection).

BRIEF SUMMARY OF THE INVENTION

An embodiment of the present invention provides a system comprising a signal transmitting and receiving system coupled to a cable, an analog-to-digital converter (ADC) coupled to the signal transmitting and receiving system, a TDR system coupled to the ADC and a memory, and a controlling system coupled to at least one of the ADC, the TDR system, and the signal receiving and transmitting system. The controlling system includes a controller and one or more state machines that are used to control the TDR system.

In one example, the system is used to perform a method of detecting if remote device connecting to an Ethernet IEEE 802.3 network is physically removed without depending on link and without interfering with on going normal Autonegotiation process.

Another embodiment of the present invention provides a method comprising the steps of (a) determining whether a user has selected a manual mode of TDR detection, (b) performing TDR detection when the manual mode is selected, then returning to step (a), (c) determining whether a cable is disconnected when the manual mode is not selected, (d) notifying a cable disconnect state machine when the cable is disconnected then returning to step (a), (e) determining whether a user has selected an auto trigger mode, (f) notifying a TDR self trigger state machine when the auto trigger mode is selected, then returning to step (a), and (g) returning to step (a) if the auto trigger mode is not selected.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 7:
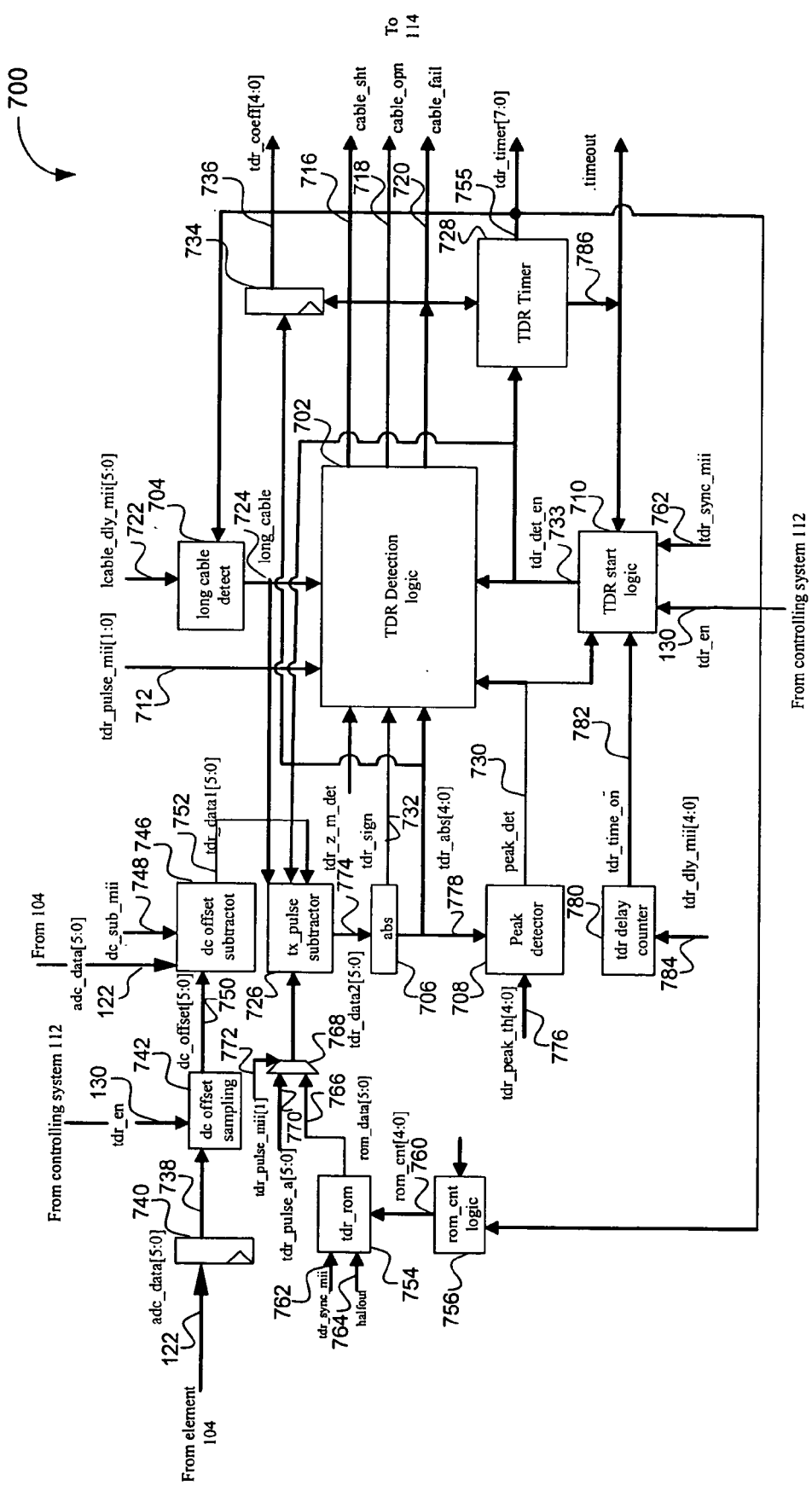

FIG. 7 shows a block diagram depicting a system 700 (e.g., TDR logic), according to one embodiment of the present invention The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview
Overall System
Overview of TDR Detection
Exemplary Controlling System
Exemplary Cable Disconnect State Machine
IP Phone Connectivity Status Determination Using TDR
Parallel Detection For Determining Connectivity Status
Exemplary TDR Self Triggering State Machine
Exemplary Computer System
Exemplary TDR Detection System Overview While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a system for performing cable diagnostics, such as determining open state, short state, and connectivity, more accurately than conventional systems and without taking up any additional overhead.

Overall System

Figure 1:
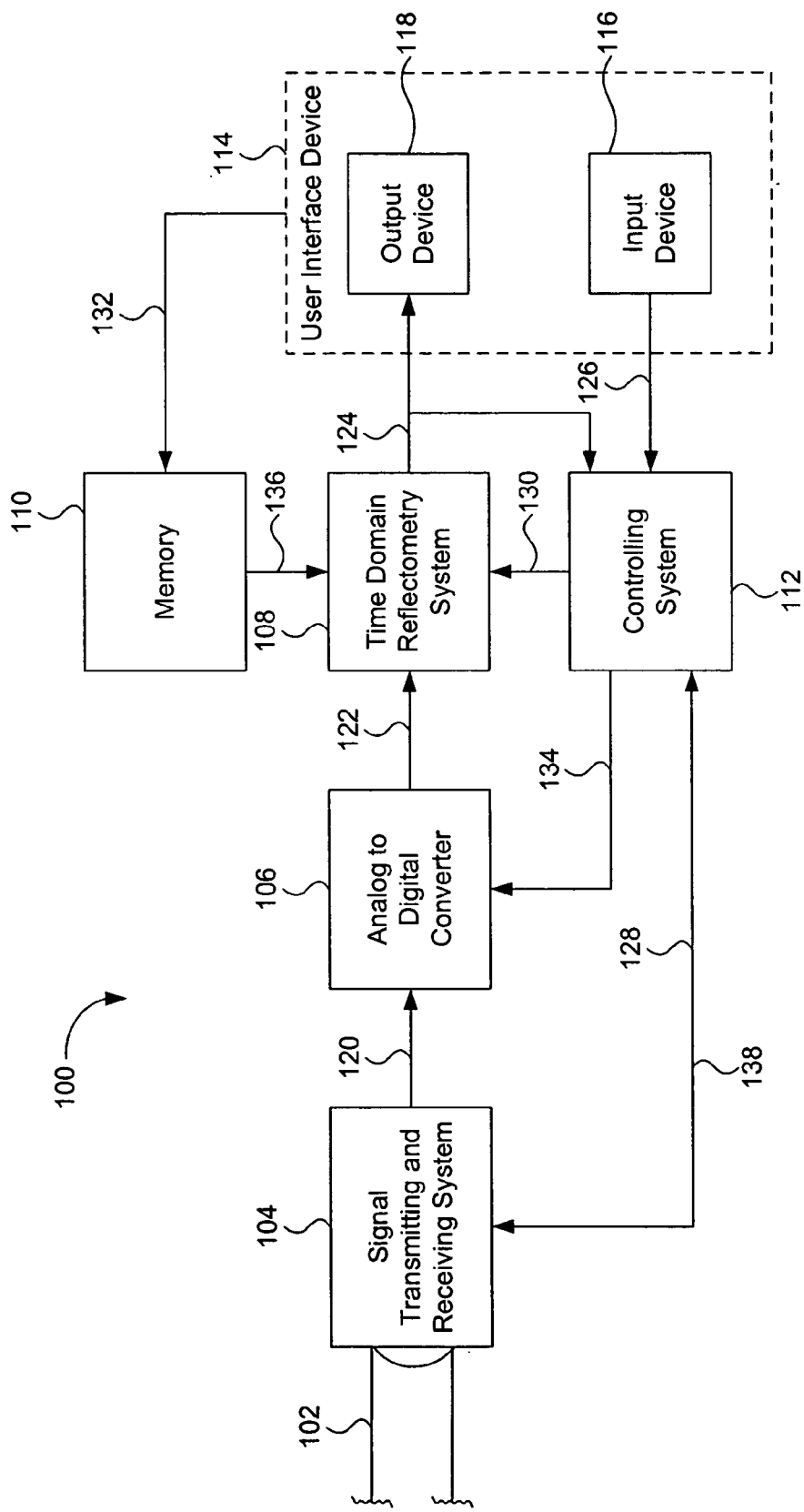
FIG. 1 shows a system, according to one embodiment of the present invention.

FIG. 1 shows a system 100, according to one embodiment of the present invention. System 100 includes a cable 102, a signal transmitting and receiving system 104, an analog-to-digital converter (ADC) 106, and a time domain reflectometry (TDR) system 108, a memory 110, a controlling system 112, and a user interaction device 114. User interaction device 114 includes an input device 116 and an output device 118.

In one example, memory 110 can be a programmable memory device, such as a programmable register, or any other memory device that stores constant value until new values are received, as would become apparent to one of ordinary skill in the art.

In one example, user interaction device 114 can be a firmware, hardware, and or software that allow for inputting and outputting of information, such as a personal computer, or the like. In one example, input device 116 can be a keyboard, a disk drive, a CD ROM drive, or the like. In one example, output device can be a graphical user interface, a printer, a transmitter transmitting signals through a wireless or wired system or network, or the like.

Signal transmitting and receiving system 104, under control of controlling system 112, generates and transmits a signal along cable 102. For example, a square wave signal or pulse signal can be generate and transmitted along cable 102. A return or reflection signal is then received at signal transmitting and receiving system 104. An analog signal 120 is then transmitted to ADC 106 representing the received or reflected signal from cable 102.

ADC 106 produces a digital signal 122 from analog signal 120, which is received at TDR system 108. When enabled by controlling system 112, TDR system 108 processes digital signal 122 in order to determine characteristics about cable 102. For example, a determination can be made whether cable 102 has an open or short error, how long cable 102 is, if cable 102 is linked (connected) on two or more ends to devices, if cable 102 is linked without have any energy flow or having energy flow, etc. A result signal 124 based on the processing in TDR system 108 is transmitted to output device 118, which is used to generate an indication output to a user as to the state of cable 102. In one example, signal 124 is also transmitted to controlling system 112.

In one example, input device 116 allows a user generate a signal 126 to controlling system 112. In this example, controlling system 112 would then send a control signal 128 to signal transmitting and receiving system 104, which directs system 104 to perform a desired test. In another example, control signal 128 can be self-generated within controlling system 112, which will be described in more detail below.

In another example, signal 126 can also be used to direct controlling system 112 to generate a control signal 130, which will enable TDR system 108 and initiate processing of signal 122. In this example, input device 116 can be used to transmit new constant values to memory 110 via a signal 132 that will be used during the processing of signal 122. In another example, constant values stored in memory 110 need not be updated or changed. In either case, a set of constant values 136 is either sent or accessed from memory 110 to TDR system 108.

In a further example, either through self triggering or receipt of signal 126, controlling system 112 can generate a control signal 134 that is used to control various aspects of ADC 106, as would become apparent to one of ordinary skill in the art.

In a still further example, controlling system 112 can also receive a signal 138 from signal transmitting and receiving system 104, such as when cable 102 appears to be disconnected (i.e., no link or link signal is detected) or not receiving energy.

In a still further example, a rising edge of the reflection in cable 102 is detected. This feature can be very important when there is an analog High-Pass Filter (HPF) (not shown) positioned before ADC 106 and cable disconnection auto-detection in the normal mode is desired. In this case, TDR can evaluate any positive reflection of a link pulse used as the test pulse in cable 102 due to the disconnection of cable 102. Because of the distortion of the HPF, subtraction of the ADC samples using a TDR internal look-up table for link pulse samples might not be possible. Thus, detection of reflection by looking at second positive transition due to the reflection may still be possible.

Overview of TDR Detection

In system 100, or other systems discussed below and/or methods discussed below, TDR detection can be based on two transmission line characteristics of cables: reflection coefficient and Velocity of Propagation (VOP).

In one example, a Reflection Coefficient (Rcoeff) can be defined using the following equation:

$$Rcoeff = \rho_L = V_{Reflected}/V_{source} = (Zl-Zc)/(Zl+Zc)$$

According to this approach, Zl is the load impedance at the termination of cable 102 and Zc is the characteristic impedance of cable 102. Also, $V_{reflected}$ is the voltage of the reflected wave and $V_{source}$ is the voltage of the transmitted wave. When there is an open (cable disconnected) in cable 102, Zl>Zc and there can be a reflection with the same polarity of the transmitting waveform. This can be shown as:

$$Z_L = \infty = \rho_L = (\infty - Z_0)/(\infty + Z_0) = 1 \text{ (open error)}$$

When there is a short in cable 102, Zl<Zc and there can be a reflection with the opposite polarity of the transmitting waveform. This can be shown as:

$$Z_L = 0 = \rho_L = (0 - Z_0)/(0 + Z_0) = -1 \text{ (short error)}$$

A determination can be made whether the reflection is above a noise threshold and an amplitude of the reflection, which can be used to further investigate the mismatch of the impedance due to different cable faults.

VOP is intrinsic to cable 102, and can be treated as a constant (e.g., for Cat-5 cable, the VOP=5 ns/m). Measuring the propagation delay of the reflection results in a determination of where along cable 102 an open or short exists as a function of distance. A timer and a synchronous logic circuit (not shown) can be used to measure propagation delay. The timer can be turned on when the transmitted waveform appears on cable 102 to be tested, and can be disabled after detection of a reflection. A timer counter number represents the propagation delay in terms of clock cycles, as is well known.

Analog and/or digital circuits, for example in a 10/100 transceiver (i.e., 10BaseT Compliance: IEEE 802.3 and 10BaseTX Compliance: IEEE 802.3$u$ to allow 10 or 100 Gigabit per second signal transmission), can be used to transmit and receive test pulses and return signals, respectively. In one example, the TDR function can be readily integrated in a 10/100 physical layer device (PHY). PHY is the lowest layer and it deals primarily with transmission of the raw bit stream over the PHYsical transport medium. In the case of wireless LANs, the transport medium is free space. The PHY defines parameters such as data rates, modulation method, signaling parameters, transmitter/receiver synchronization, and the like.

Exemplary Controlling System

Figure 2:
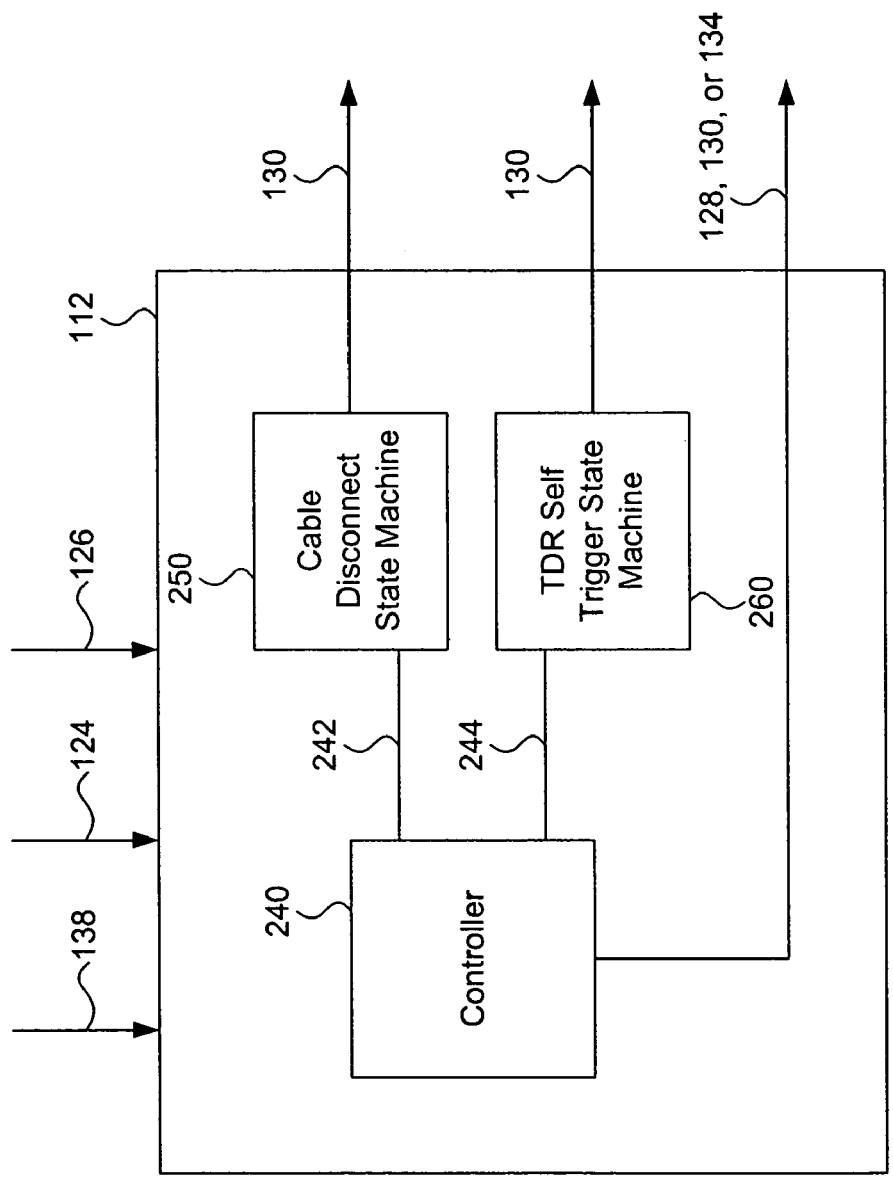
FIG. 2 shows an exemplary controlling system in the system of FIG. 1, according to one embodiment of the present invention.

FIG. 2 shows an exemplary controlling system 112, according to one embodiment of the present invention. In this embodiment, controlling system 112 includes a controller 240 (FIG. 3), a cable disconnect state machine 250 (FIG. 4), and a TDR Self Trigger State Machine 260 (FIG. 5), which are all discussed in more detail below. Controller 240 determines whether a user has selected a mode, and if so, which mode a user has selected for system 100 to operate in. Depending on the mode, controller 240 can enable state machine 250 using a signal 242 or state machine 260 using signal 244, as will be described in more detail below with respect to FIG. 3. If the user has selected a manual mode, controller 240 can enable TDR system 108 directly, which is also discussed in more detail below.

Figure 3:
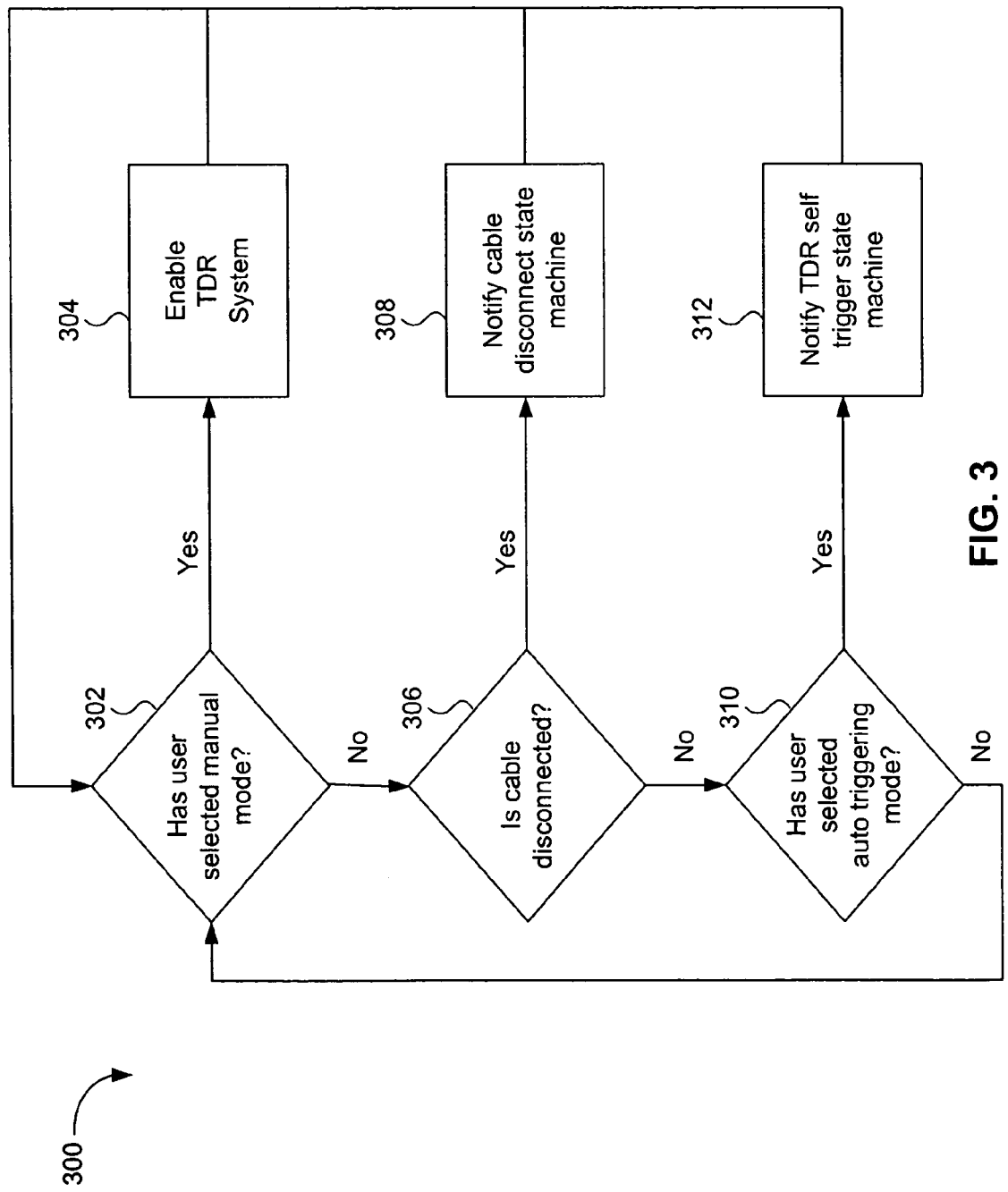
FIG. 3 is a flow chart depicting a method operating in a controller in the system of FIG. 1, according to one embodiment of the present invention.

FIG. 3 is a flow chart depicting a method 300 operating in controller 240, according to one embodiment of the present invention.

In step 302, a determination is made whether a user has selected a manual mode. For example, this selection is made through input device 116. If yes (manual mode selected), TDR system 308 is notified and/or enabled, for example via control signals 128, 130, and/or 134. After TDR system 108 is enabled, method 300 returns to step 302. If no (manual mode not selected), method 300 moves to step 366.

In step 306, a determination is made whether cable 102 has been detected or sensed as being disconnected. For example, when controlling system 102 receives a signal 138 that can indicate this is a state of cable 102. If cable 102 is determined to be disconnected, Cable Disconnect State Machine 250 is notified and/or enabled, for example via signal 242. After notifying state machine 250, method 300 returns to step 302. If cable 102 is not determined to be disconnected, then method 300 moves to step 310.

In step 310, a determination is made whether a user has selected an auto triggering mode of operation for system 100. For example, this selection is made through input device 116. If yes (auto triggering mode is selected), TDR Self Trigger State Machine 260 is notified and/or enabled, for example via control signal 244. After state machine 260 is enabled, method 300 returns to step 302. If no (auto triggering mode is not selected), method 300 returns to step 302.

Exemplary Cable Disconnect State Machine

Figure 4:
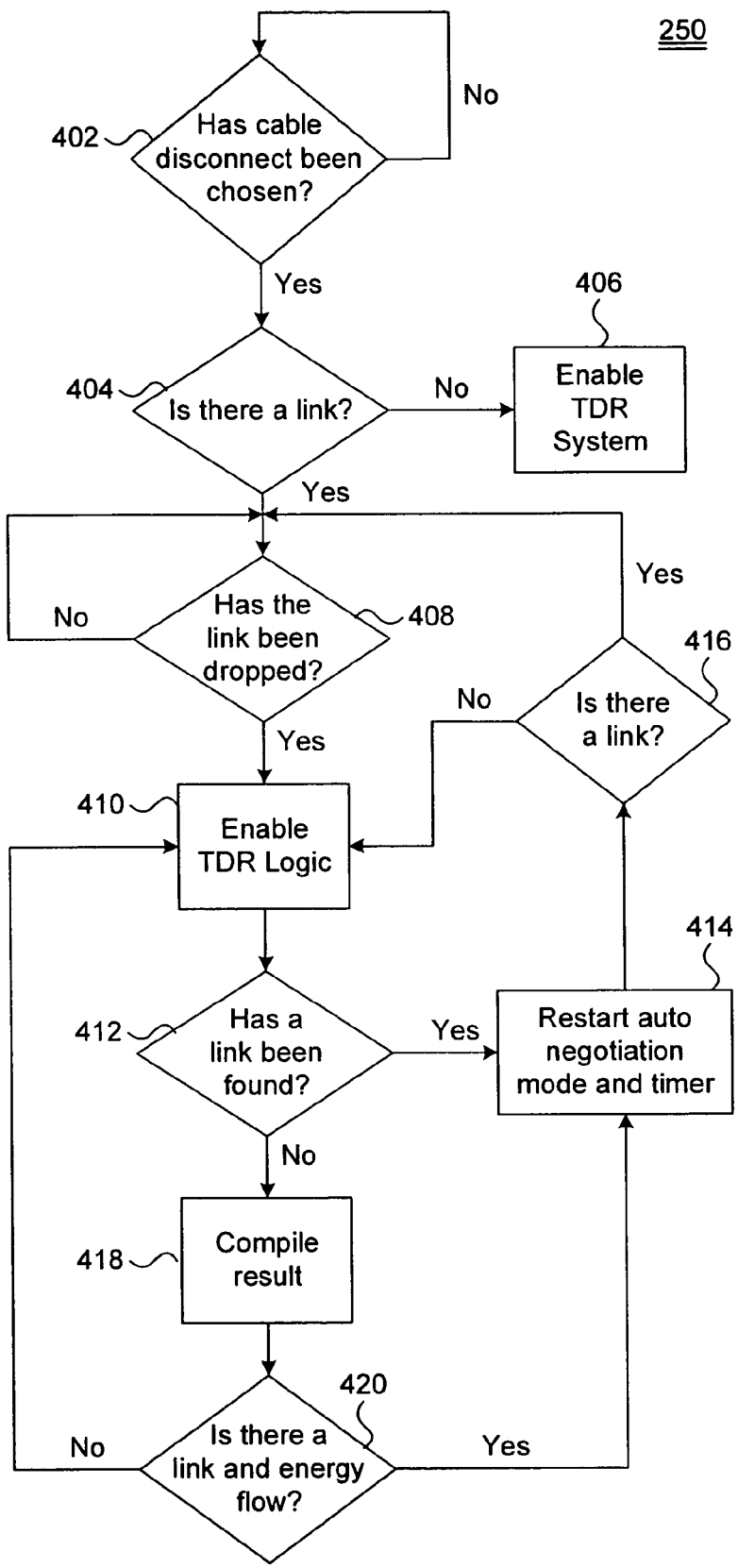
FIG. 4 shows a flowchart depicting an operation occurring in a Cable Disconnect State Machine, according to one embodiment of the present invention.

FIG. 4 shows a flowchart depicting an operation occurring in Cable Disconnect State Machine 250, according to one embodiment of the present invention. When state machine 250 is running, connectivity of cable 102 is constantly monitored.

In step 402, a determination is made whether cable disconnect mode has been chosen. In one example, this is based on receiving signal 242 from controller 240. If no, state machine 250 remains idle and continues to check whether cable disconnect mode has been chosen. If yes, the operation moves to step 404.

In step 404, a determination is made whether cable 102 is linked to desired devices. For example, this is based on controlling system 112 receiving signal 138 from signal transmitting and receiving system 104. If no link is found, the operation moves to step 406, which is used to send signal 130 to TDR system 108, which enables or initiates processing of signal 122 with respect to signals 136. If a link is found, the operation moves to step 408.

It is important to quickly determine if a link has really been dropped and/or the state of cable 102. If there cable 102 is still linked, but to an undesired device that does not transmit back a link signal, the device can be damaged. Thus, although no link signal is being transmitted back, cable 102 may still be linked and processing of signal 122 can be used to determine an actual status of cable 102.

In step 408, a determination is made whether, assuming there was a link, has it subsequently been dropped. If no (a link was not dropped), state machine 250 continues to check if a link has been dropped. For example, a timer is started for each NO determination, and once the timer expires the system checks again. In one example, this occurs every 16 cycles. For example, when state machine 250 is operating at 25 Mhz, each cycle takes 40 ns ($10^{-9}$ seconds), so the check is done every 640 ns.

If yes (i.e., a link was droped), the operation moves to step 410, which is used to send signal 130 to TDR system 108, which enables or initiates processing of signal 122 with respect to signals 136. After processing signal 122, in step 412 a determination is made whether a link has been found. In this embodiment, this is done through receipt of signal 124 at controlling system 112 from TDR system 108. If yes, the operation moves to step 414. If no, the operation moves to step 418.

In step 414, an autonegotiation mode is restarted, which is based on a IEEE 802.3 standard autonegotiation state machine, which standard is incorporated herein by reference in its entirety. The autonegotiation mode then operates in parallel with state machine 250. Also, during step 414, a timer is started. For example, the timer can be a 5 second timer. After the shorter of a predetermined time period of the autonegotiation mode or the expiration of the timer, in step 416 a determination is made whether a link has been found. If yes, the operation returns to step 408. If no, the operation returns to step 410.

Returning to after step 412 when no link has been found, the operation begins step 418. In step 418, results from processing performed in TDR system 108 are compiled. In step 420, a determination is made, based on the compiled results, whether TDR system 108 determined cable 102 was linked and/or cable 102 had energy flowing thereon. For example, a determination can be made whether cable 102 has an open or short error or failed to show anything. If yes, the operation continues to step 414. If no, the operation continues to step 410.

Exemplary TDR Self Trigger State Machine

Figure 5:
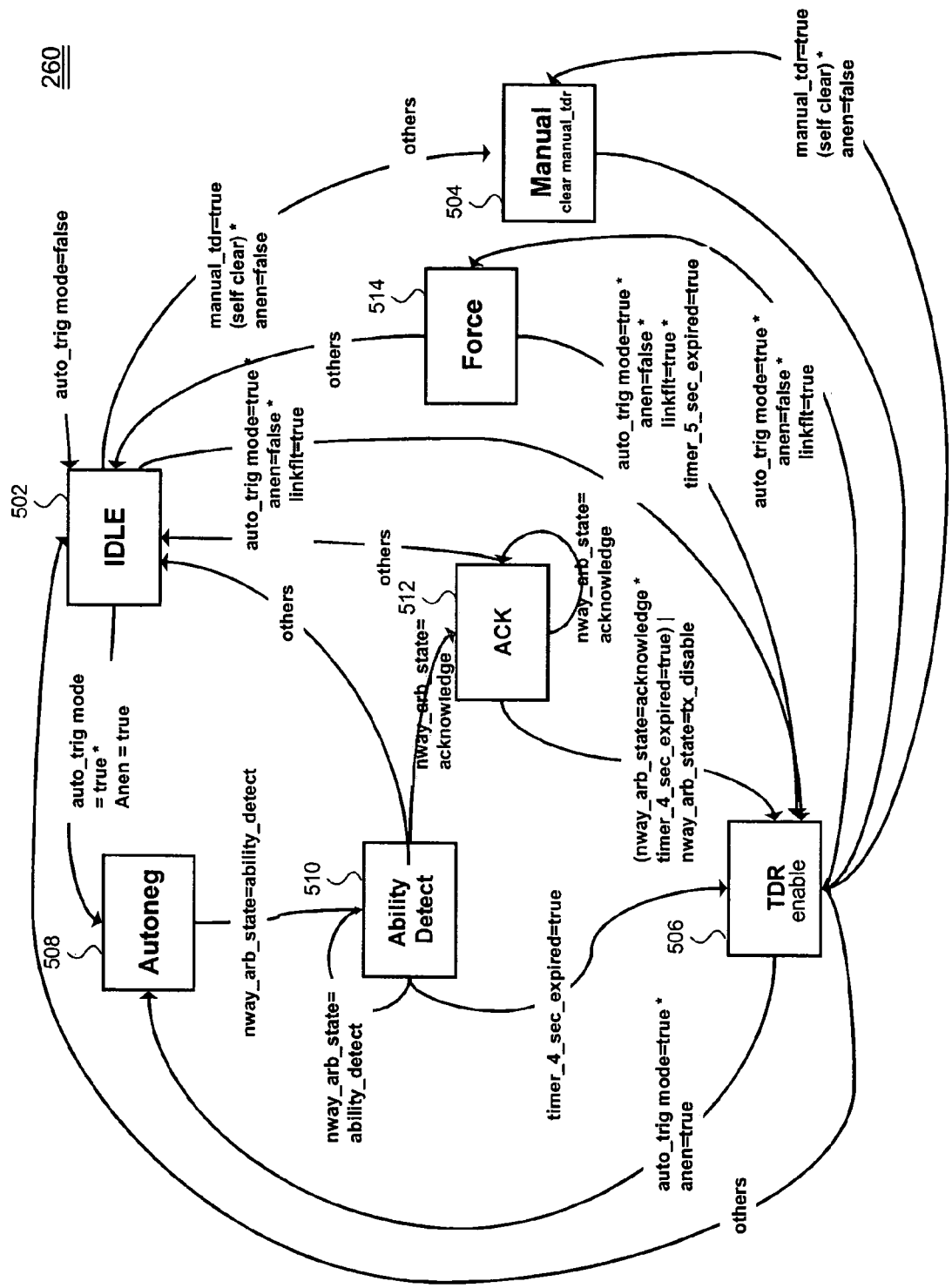
FIG. 5 shows an operation of a TDR Self Triggering State Machine, according to one embodiment of the present invention.

FIG. 5 shows an operation of state machine 260, according to one embodiment of the present invention. Signals that cause state machine 260 to move between modes according to this embodiment shown in the figure are defined in Table 1. Table 2 includes brief descriptions of the states of state machine 260.

TABLE 1

| | |
|---|---|
| Auto_trig mode | When true, auto triggering mode has been selected, and when false auto triggering mode has not been selected. |
| Anen | When true, autonegotiation mode is operating, and when false autonegotiation mode is not operating |
| Manual_tdr | When true, manual enabling and/or initiating of TDR system has been selected, and when false it has not been selected |
| Linkflt | When true, no link has been found on a cable, and when false a link exists on a cable |
| Nway_arb_state | N is an integer value of 1, 2, . . . and this signal is related to whether all devices on cable 102 have ability to detect link or not and/or ability to acknowledge link or not |

TABLE 1-continued

| | |
|---|---|
| Timer_4_sec_expired | When true, timer has expires, when false timer has not expired |
| Timer_5_sec_expired | When true, timer has expires, when false timer has not expired |
| others | If everything not satisfied that is associated with the respective state, operation of state machine follows this path |

TABLE 2

| | |
|---|---|
| IDLE state 502 | In this state, the state machine waits until an auto trigger mode is chosen by a user |
| Manual state 504 | In this state, a user manually determines when to initiate move into TDR enable state 506 |
| TDR enable state 506 | In this state an enable signal is send to TDR system 108 to start a processing cycle |
| Autoneg state 508 | In this state, an autonegotiation state machine is operation under the IEEE 802.3 standard |
| Ability Detect state 510 | In this state, which is also within an autonegotiation state machine, devices coupled to cable 102 have the ability to negotiate and determine link status |
| ACK state 512 | In this state, also within an autonegotiation state machine, devices coupled to cable 102 have the ability to acknowledge link status |
| Force state 510 | In this state, a user has directed the state machine 250 to force a change of state to TDR enable state 506 |

In IDLE state 502, a determination is made whether auto trigger mode has been chosen. In one example, this is based on receiving signal 244 from controller 240. If no, state machine 260 remains in IDLE state 502, and continues to check whether auto trigger mode has been chosen. If yes, state machine 260 determines whether manual mode has also been selected and an autonegotiation mode is not being run. As discussed above, autonegotiation mode corresponds to an autonegotiation mode described in the IEEE 802.3 standard.

If manual mode was also chosen, the operation moves to Manual state 504, which self clears after being entered. Then the operation moves to TDR enable state 506, which enables and/or initiates processing in TDR system 108. After TDR enable state 506 enables and/or initiates TDR system 108, the operation returns to Manual state 504. Unless controlling system 112 receives input that a user has chosen another mode, once in Manual state 504 controlling system 112 remains in Manual state 504.

If manual mode has not been selected and if cable 102 is linked, the operation remains in IDLE state 502.

If manual mode has not been selected, auto trigger mode has been selected, autonegotiation mode is not running, and cable 102 is not linked, the operation moves to TDR enable state 506. If auto triggering mode is chosen and autonegotiation mode is running, the operation moves to Autoneg state 508, which runs an autonegotiation state machine (not shown).

From Autoneg state 508, the operation moves to Ability Detect state 510 when state machine 260 determines all the devices coupled to cable 102 have the ability to detect link state, i.e., they are capable of negotiation. In one example, Ability Detect state 510 is also part of an autonegotiation state machine (not shown). The operation remains in Ability Detect state 510 until a timer expires, which enables and/or initiates TDR system 108 via TDR enable state 506. For example, a 4 second timer is used, so that every four seconds the operation pings TDR system 108 to process signal 120 and generate an output signal to determine connectivity status. It is to be appreciated that other durations can be used based on an application. If any of the parameters are no longer met in order for the Ability Detect state 510 to continue or move to another state, the operation returns to IDLE state 502.

The operation moves to ACK (acknowledge) state 512 from Ability Detect state 510 if it is determined devices coupled to cable 102 can acknowledge link status. The operation remains in ACK state 512 until a timer expires or when the ability for all devices coupled to cable 102 to determine link status is no longer true. As shown in the figure, if none of the parameters are met to remain in ACK state 512 or move to TDR enable state 506, the operation moves back to IDLE state 502.

Unless discussed above, from TDR enable state 506 one of two state changes can occur.

In a first state change, if none of the parameters are met, as shown in the figure, the operation moves back to IDLE state 502.

In a second state change, if auto trigger mode is still active, there is no autonegotiation mode operation, and there is no link, then the operation moves to a Force state 514. So long as the parameters shown remain the same, the operation returns to TDR enable state 506 every expiration of a timer that is started once Force state 514 is entered. For example, a five second timer can be started, and the operation moves from Force state 514 to TDR enable state 506 every five seconds, which enables and/or initiates system 108 every five seconds. However, if any of these parameters are no longer met, the operation returns to IDLE state 502. It is to be appreciated that this timer can have other durations.

IP Phone Connectivity Status Determination Using TDR

In one example, controlling system 112, or devices therein, provides a method of continuously detecting cable disconnect without interfering with normal Autonegotiation process. This can be done to detect a case where an IP Phone is removed (disconnected from a switch) so that power to the IP Phone can be terminated (cut-off). This is used in a situation where the switch controls power to the IP Phone through cable 102, and system 100 needs to immediately detect if cable 102 is removed so that power can be removed from cable 102, e.g., for safety reasons, for example.

In one example, connectivity detection/monitoring is done by monitoring a Link signal. Almost immediately after a determination is made that the Link has been dropped, an Autonegotiation mode can be forced to begin following a delay, which can be much shorter than a Break_link_timer period required in a normal Autonegotiation mode. At this time, while listening for a fast link pulse (FLP) on a receiving twisted wire pair (an RX pair), the reflection of a FLP on a transmitting twisted wire pair (a TX pair) can be monitored by system 100. The presence of a number of repeating FLP reflections (preventing false detection) can indicate that cable 102 has been removed from the IP Phone.

In one example, a 10BT (i.e., "ten-base-tee", which is 10 Mbs Ethernet that uses twisted-pair cable and generally devices are linked via a common hub) normal link pulse (NLP) can be used instead of Autonegotiation's FLP in force 10BT mode instead of using Autonegotiation. This can work with Auto-MDIX as well. Auto-MDIX is used to describe standard wiring for hubs and switches dubbed "MDIX" (Media Dependent Interface with Crossover). On some devices, it is possible to automatically correct for improper cabling, and so the distinction between a straight-through and a crossover cable becomes unimportant, this capability is normally called Auto-MDIX.

In one example, if Force 100TX (i.e., 100 megabit per send signal transmission) is required, Autonegotiation can still be used to parallel detect 100TX and system 100 can switch back to force mode. Removal of cable 102 is monitored as long as the Link signal is not found (a Link is down). In this example, it is desired to keep monitoring when cable 102 is removed. The Link signal will come back up normally. In one example, NLP can have about 16 ms+/−8 ms spacing, which means that it could take about 16–17 ms to report cable disconnected. Minimum spacing can be reduced to about 8 ms for some applications.

In one example, during Autonegotiation, during which Signal Detect is used to detect NLP/FLP on the RX pair, 100TX's ADC is switched to a TX pair. The minimum spacing between FLP can be about 55 μs. The typical reflection time of 200 meters can be about 2 μs. TDR system 108 is used to detect the original FLP and its reflection. State machine 250 can use the original FLP detection as a starting point and look for any pulse within 2 μs.

In one example, to simplify the logic and make it more reliable, detection and/or monitoring using system 100 focuses on only an open cable and ignores a short cable. The difficult part with a short cable is where reflection is overlapped. Removing the original Link Pulse (similar concept as echo canceller in Gigabit) can be used for an overlapping case. Another solution can be to use a HPF, as discussed above, to detect the rising edge of Link Pulse. Any other rising edge with in 2 μs will indicate open cable. A HPF can reduce the width of the Link Pulse, and therefore make the blind spot smaller. This can be used for either Autonegotiation mode or 10/100 mode.

Parallel Detection For Determining Connectivity Status

In another example of using controlling system 112, or the devices therein, a switch box can supply power to an IP Phone through a phone line in the same manner as normal analog Phone. The IP phone can work even if the power around the house/office is out (e.g., when a switch has a backup power supply). However, the switch can stop supplying power to the phone line if there is no phone connected at the other end. For example, another device could have been plugged to the phone jack, such as computer, which uses a same RJ45 connector as the phone jack, or the phone jack can be damaged.

A Link pulse can be used to determine if the IP Phone has been removed. Power would be removed if the Link has been dropped. However, there are cases where the Link is dropped, but the phone is still connected. For example, someone might reset/reboot the IP phone, which causes the Link to drop. In this case, cutting the power can result in system 100 taking up to a few minutes to detect the IP Phone and to initialize it.

In one example, this detection of when the IP Phone has been removed from phone line is done using the TDR detection/monitoring discussed above and below with respect to the figures described herein. System 100 should continuously monitor the phone line after the Link is dropped to detect phone removal. In one case, a phone may be turned off (e.g., no Link), but is still plugged to phone line for days before being removed. Power can be supplied to the phone as long as it is connected, but power should be removed when the phone is removed.

Also, when using the TDR detection/monitoring discussed above and below with respect to the figures described herein, operation of system 100 should not interfere with normal operation of the Autonegotiation or a Phone discovery process during Link Down. This is because in some cases the TDR process can be disruptive since it sends out energy pulses on the line for reflection. In one example of the operation of system 100, discussed with respect to an operation of controlling system 112, this is compensated for by not sending out any energy pulses, but by using the normal pulse of the Autonegotiation and/or a Phone discovery process. Then, system 100 can look for their reflection.

Further, when using TDR, system 100 should immediately detect when the phone is disconnected to avoid damaging other devices that may be plugged in to the phone jack. Normally, Link drop processes (as specified by IEEE standard 802.3u) can take too long for link to drop after the phone is removed. Therefore, operation of controlling system 112 includes the use of a programmable timer. When the IP Phone is connected, a desired time period less than an IEEE standard 802.3u time period can be used so that the Link will drop faster when the phone is removed than when the standard is used.

Exemplary Computer System

Figure 6:
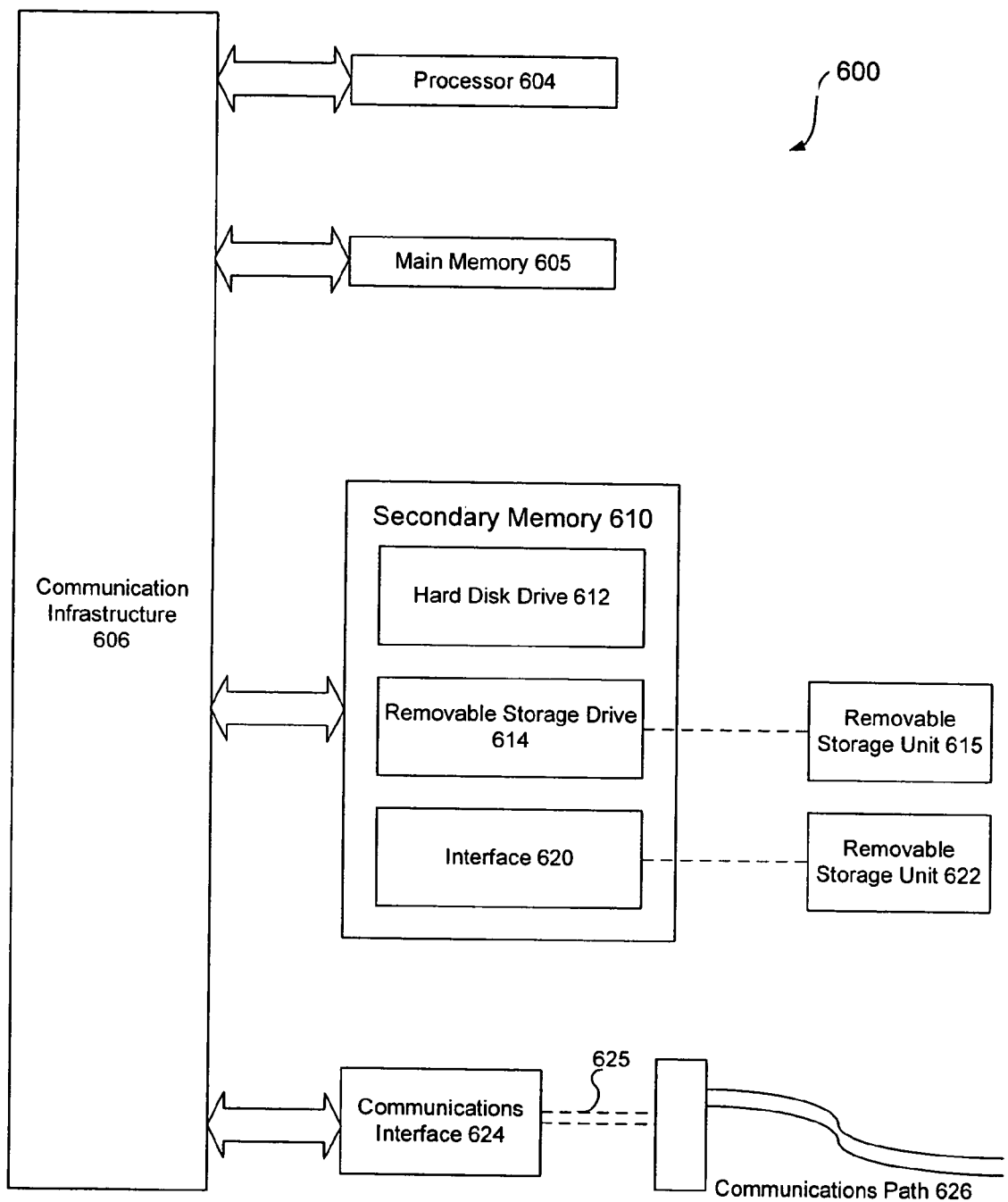
FIG. 6 illustrates an example computer system 600, in which the present invention can be implemented as computer-readable code.

FIG. 6 illustrates an example computer system 600, in which the present invention can be implemented as computer-readable code. Various embodiments of the invention are described in terms of this example computer system 600. After reading this description, it will become apparent to a person skilled in the relevant art how to implement the invention using other computer systems and/or computer architectures.

The computer system 600 includes one or more processors, such as processor 604. Processor 604 can be a special purpose or a general purpose digital signal processor. The processor 604 is connected to a communication infrastructure 606 (for example, a bus or network). Various software implementations are described in terms of this exemplary computer system. After reading this description, it will become apparent to a person skilled in the relevant art how to implement the invention using other computer systems and/or computer architectures.

Computer system 600 also includes a main memory 608, preferably random access memory (RAM), and may also include a secondary memory 610. The secondary memory 610 may include, for example, a hard disk drive 612 and/or a removable storage drive 614, representing a floppy disk drive, a magnetic tape drive, an optical disk drive, etc. The removable storage drive 614 reads from and/or writes to a removable storage unit 618 in a well known manner. Removable storage unit 618, represents a floppy disk, magnetic tape, optical disk, etc. which is read by and written to by removable storage drive 614. As will be appreciated, the removable storage unit 618 includes a computer usable storage medium having stored therein computer software and/or data.

In alternative implementations, secondary memory 610 may include other similar means for allowing computer programs or other instructions to be loaded into computer system 600. Such means may include, for example, a removable storage unit 622 and an interface 620. Examples of such means may include a program cartridge and cartridge interface (such as that found in video game devices), a removable memory chip (such as an EPROM, or PROM) and associated socket, and other removable storage units 622 and interfaces 620 which allow software and data to be transferred from the removable storage unit 622 to computer system 600.

Computer system 600 may also include a communications interface 624. Communications interface 624 allows software and data to be transferred between computer system 600 and external devices. Examples of communications interface 624 may include a modem, a network interface (such as an Ethernet card), a communications port, a PCM-CIA slot and card, etc. Software and data transferred via communications interface 624 are in the form of signals 628 which may be electronic, electromagnetic, optical or other signals capable of being received by communications interface 624. These signals 628 are provided to communications interface 624 via a communications path 626. Communications path 626 carries signals 628 and may be implemented using wire or cable, fiber optics, a phone line, a cellular phone link, an RF link and other communications channels.

In this document, the terms "computer program medium" and "computer usable medium" are used to generally refer to media such as removable storage drive 614, a hard disk installed in hard disk drive 612, and signals 628. Computer program medium and computer usable medium can also refer to memories, such as main memory 608 and secondary memory 610, that can be memory semiconductors (e.g. DRAMs, etc.) These computer program products are means for providing software to computer system 600.

Computer programs (also called computer control logic) are stored in main memory 608 and/or secondary memory 610. Computer programs may also be received via communications interface 624. Such computer programs, when executed, enable the computer system 600 to implement the present invention as discussed herein. In particular, the computer programs, when executed, enable the processor 604 to implement the processes of the present invention, such as operations in controller 240 and state machines 250 and 260 discussed above. Accordingly, such computer programs represent controlling systems of the computer system 600. Where the invention is implemented using software, the software may be stored in a computer program product and loaded into computer system 600 using removable storage drive 614, hard drive 612 or communications interface 624.

Exemplary TDR Detection System

FIG. 7 shows a block diagram depicting an exemplary TDR system 108, according to one embodiment of the present invention. The labels, descriptions, and signals found in this figure are exemplary only, and are not meant to be limiting. Other signals and devices may be used within system 108, as would be known to one of ordinary skill in the relevant arts.

System 700 includes TDR detection logic 702 that directly or indirectly receives and generates most of the signals in TDR system 108. All input signals are programmable constants stored in memory 110, as described above with respect to FIG. 1, except signal 122 and signal 130, also described above.

TDR detection logic 702 is also called a controlling system in the description of FIG. 7. Controlling system 702 receives signals from a long cable detect device 704, an absolute value block 706 (abs), a peak detector block 708, and a TDR start logic block 710. Controlling system 702 also receives signals tdr_pulse_mii 712 and tdr_z_m_det 714 from memory 110. From these inputs, controlling system 702 determines a condition of a cable and produces signals cable_sht 716 (short), cable_opn 718 (open), or cable_fail 720 (fail). Signals 716, 718, and 720 are transmitted as indicators to user interface device 114.

Long cable detect device 702 is used to generate a control signal long_cable 724. Control signal 724 is used to enable a subtraction operation of tx_pulse subtractor 726 when long_cable signal 724 is set to 0, indicating a time window when the transmitting pulse 102 and TDR reflection could overlapped on the ADC samples of the cable. When long_cable signal 724 is set to 1, the ADC samples should be the only TDR reflection and there will be no subtraction in tx_pulse subtractor 726. The long_cable signal 724 is also used by TDR Detection logic 702 to only detect any reflection after long_cable signal 724 is set to 1 after TDR Timer counter 728 reaches the programmed value of 1cable_dly_mii[5:0] 722.

TDR Detection logic 702 processes these incoming signals for the cable open and short determination using TDR detection algorithms. TDR Detection logic 702 receives a peak_det signal 730 from a peak detector 776, which indicates whether signal 778 from abs device 706 is above or below a threshold level set by signal tdr_peak_th[4:0] 776, discussed below. TDR Detection Logic also receives tdr_sign signal 732 from abs device 706, which indicates a signal of subtraction results signal 774. Processing of the signal received at TDR Detection Logic 702 is enabled or is initiated, as discussed above, based on signals tdr_en 130 and tdr_sync_mii 762 received by TDR start logic 710. When either of these signals indicates that controlling system 112 has indicated TDR system 108 should operate, TDR start logic 710 generates tdr_det_en signal 733, which enables and/or initiates TDR Detection logic 702.

When any cable fault is detected, cable_fail signal 720 is set to 1, and this signal is also used to stop the TDR Timer 728 for the TDR delay measurement. Cable_fail signal 720 is also used to enable a register 734 to transmit a tdr_coeff [4:0] signal 736 to store a current analog-to-digital converter (ADC) sample (e.g., a ads_data [5:0] signal 122, discussed below) as a peak of a TDR reflection. When TDR Detection logic 702 detects an open, it will set cable_opn signal 718 to 1. When TDR Detection logic 702 detects a short, then it will set cable_sht signal 716 to 1.

Adc_data[5:0] signal 122 is received at register 740 from an ADC 106. In this example, signal 122 is a 6-bit ADC signal. Signal 122 is received at dc offset sampling device 742 along with tdr_en signal 130. Dc_offset sampling device 742 is used to sample the dc offset of ADC signal 122. Device 742 will register ADC signal 122 when the control signal tdr_en 130 changes from 0 to 1. Device 742 will take this registered value as dc offset of ADC signal 122, which will be used to calibrated ADC sample 122.

Dc offset subtractor device 746 is a digital subtractor. When the control signal dc_sub_mii signal 748 is set to 1, device 746 will subtract the current ADC sample 122 from a registered DC offset signal 750 (dc_offset[5:0]). When dc_sub_mii signal 748 is set to 0, device 746 will just bypass DC offset signal 750, i.e., perform no subtraction. An output signal of device 746 is a tdr_data[5:0] signal 752, which is signal 750 subtracted from signal 122.

DC-offset cancellation is desirable for reliable TDR detection when there is some dc offset in the ADC circuits. According to one embodiment of the present invention, system 700 has a very simple dc offset cancellation logic, which only includes a register 742 and subtractor 746 with minimal glue logic. After the TDR detection is initiated, there is 8-cycle timing window before a pulse is sent into cable 102, ADC data is sampled, and the ADC data is registered as the dc offset. The dc-offset subtraction is programmable, when it is enabled, and the ADC data will be subtracted by this dc offset sampled at the beginning of TDR detection.

In one example, a more accurate dc offset sampling can be done by accumulating more samples of ADC data before sending a signal into cable 102, and then taking an average of the dc offset sample to smooth out any glitches.

According to one embodiment of the present invention, a simple logic is chosen and a control bit is added for this subtraction. This allows multiple TDR detection on the same cable with and without the dc-offset subtraction enabled, and then a comparison can be made between all the results and provide a reliable TDR detection result.

Tdr_rom device 754 and rom_cnt logic device 756 are used to control transmission of a reference link-pulse signal rom_data[5:0] 766. The rom_cnt logic device 756 uses tdr_timer[7:0] signal 755 from TDR Timer 728 as a timing reference to transmit a rom_cnt[4:0] signal 760, which is used as address for tdr_rom device 754. Tdr_rom device 754 transmits signal 766 under control of tdr_sync mii signal 762, which is a programmed signal that is used to control the synchronization of various devices in TDR system 108, and is also used by tdr_rom device 754 and its logic to generate different timing link pulse samples. A halfout control signal 764 is used to control the amplitude of signal 766. Tdr_rom device 754 outputs signal 766 to one channel of an multiplexer 768 that also receives a tdr_pulse_a[5:0] signal 770 at another channel, which is a square pulse signal. Which channel will pass a signal through multiplexer 768 is controlled using a signal tdr_pulse_mii[1] 772 at a control terminal of multiplexer 768. Thus, programmed signal tdr_pulse_mii[1] 772 is used to control whether the square wave (signal 770) or link pulse (signal 766) is transmitted to Tx_pulse subtractor 726.

Tx_pulse subtractor 726 is used to subtract either square wave signal 770 or pulse signal 766 from signal 752. This subtraction is enabled by the control signal tdr_det_en 733 from TDR start logic block 710 to ensure the correct timing of the subtraction. Tx_pulse subtractor 726 outputs tdr_data2[5:0] signal 774, which represents the pure reflection of the TDR measurement. ABS device 706 separates signal 774 into a sign signal 732 (tdr_sign), which is whether signal 774 has a positive or negative amplitude, and a absolute value signal 778 (tdr_abs[4:0]).

Peak detector device 708 is used to detect whether signal 778 is above a preset (programmed) threshold tdr_peak_th [4:0] signal 776. In this example, signal 774 is first converted from two's complement format to absolute value by abs block 706 producing unsigned value tdr_abs[4:0] signal 778. As discussed above, abs block 706 also generates sign signal of the ADC sample, tdr_sign 732, which will be used to determine whether there is short or open. During the detection of TDR reflection, Peak detector device 708 will compare signal 778 with programmed threshold signal 776 and will set its output peak_det signal 730 to 1 when it detects any signal 778 that is above threshold signal 776.

In the self-sync mode, Peak detector 708 is also used to detect the first ADC peak sample of the square wave pulse or link pulse that is appearing on the cable, so that the TDR start logic 710 can self-sync all the TDR logic in system 700 for the measurement.

TDR delay counter device 780 receives tdr_dly_mii[4:0] signal 784 and produces tdr_time_on signal 782, which can be used to initiate a self triggering mode of operation. TDR delay counter 780 will start to count for each clock cycle after tdr_en signal 744 is set to 1. When counter 780 reaches a value equal to the value of signal 784, TDR delay counter 780 will set tdr_timer_on signal 782 to 1 to enable TDR start logic device 710.

TDR start logic device 710 generates control signal tdr_det_en 733 that is used to start TDR detection. When programmed input signal tdr_sync_mii 762 is set to 1, the TDR logic in system 700 is in self-sync mode, and TDR start logic 710 will use peak_det signal 730 to trigger tdr_det_en 732. In one example, signal 762 can be generated from a NO decision in element 416 (FIG. 4). After tdr_en 744 is set to 1, tdr_det_en 733 will change from 0 to 1 after a first pulse (0 to 1 transition) of peak_det 730, which indicates that ADC 106 has sampled a first peak of a transmitting waveform (either square-wave or link pulse) used for TDR measurement of cable 102. When tdr_sync mii 762 is programmed to be 0, system 700 is in delay mode, which means the system 700 will start the detection after programmed delay-cycles, and TDR start logic 710 will use tdr_timer_on signal 782 to generate tdr_det_en 733.

TDR timer 728 is used to measure the time (in terms of clock cycles) between the beginning of TDR detection, when tdr_det_en 733 is set to 1, to the time when TDR Detection logic 702 detects any cable fault, which is indicated by signal cable_fail 720. TDR timer 728 will stop count after cable_fail 720 becomes 1, and the count value stored in the timer 728 is the actually the TDR delay value that will be used to report the cable length where the open or short is detected. If TDR timer 728 reaches its maximum count value and the cable_fail signal 720 is still 0, TDR timer 728 will generate a timeout signal 786. This means there is no detection of any cable fault within the cable reach between 0 to 200 meters. Timeout signal 786 is also used to self-clear the TDR start logic 710 to reset tdr_det_en signal 733 to 0 and finish the current TDR measurement According to one embodiment, simple and cost-efficient architecture can make the best use of resource sharing and simplified arithmetic in the TDR data-path. The architecture can use the same 8-bit counter for TDR delay measurement, TDR link pulse look-at table address update, and TDR detection timing window setup. The architecture can use simplified two's compliment arithmetic for computing the absolute value of the subtracted data by ignoring the LSB addition without affect the TDR detection. It can use the same 6-bit subtractor for both link pulse and square-wave subtraction. It can use the same 5-bit comparator for self-sync detection and TDR peak detection.

It is to be appreciated that any of the above elements can be implemented in firmware, hardware, software, or the like depending on a desired application or environment of system 100 and/or 700.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:
1. A system, comprising:
a signal transmitting system that transmits signals into a cable;
a signal receiving system that receives return signals from the cable that correspond to the transmitted signals;

an analog-to-digital converter (ADC) that converts the return signals into digital signals;

a time domain reflectometry (TDR) system that receives the digital signals from the ADC and signals from a memory, wherein the TDR system uses the digital signals and the signals from the memory to determine whether the cable is a in a connected without energy state, as well as whether the cable is connected or not connected; and a controlling system that controls the signal transmitting and receiving systems, the ADC, or the TDR system, the controlling system including a controller and a state machine that are used to control operation for the TDR system.

2. The system of claim 1, further comprising a user interface device coupled to at least one of the TDR system, the controlling system, and the memory.

3. The system of claim 2, wherein the user interface device includes an input device and an output device.

4. The system of claim 2, wherein the user interface device is used to program values in the memory.

5. The system of claim 2, wherein the user interface device is used to initiate a detection operation in the TDR system.

6. The system of claim 2, wherein the user interface device is used to place the TDR system in one of manual mode, self trigger mode, or cable disconnect mode.

7. The system of claim 2, wherein the user interface device is used to indicate at least one of a state and the connectivity of the cable.

8. The system of claim 7, wherein the state of the cable is one of op en, short, or no fault.

9. The system of claim 1, wherein the one or more state machines comprise a cable disconnect state machine and a TDR self trigger state machine.

10. The system of claim 1, wherein the TDR system also determines whether the cable is in open, short, or no fault state.

11. The system of claim 1, wherein the controller controls the one or more state machines.

12. The system of claim 1, wherein the controlling system is used to enable and initiate a detection operation in the TDR system.

13. The system of claim 1, wherein the controlling system is used to place the TDR system in one of manual mode, self trigger mode, or cable disconnect mode.

14. The system of claim 1, wherein the one or more state machines comprise a cable disconnect state machine.

15. The system of claim 1, wherein the one or more state machines comprise a TDR self trigger state machine.

16. A system, comprising:

a signal transmitting system that transmits signals into a cable;

a signal receiving system that receives return signals from the cable that correspond to the transmitted signals;

an analog-to-digital converter (ADC) that converts the return signals into digital signals;

a time domain reflectometry (TDR) system that receives the digital signals from the ADC and signals from a memory to determine a state of the cable or a connectivity of the cable; and a controlling system that controls the signal transmitting and receiving systems, the ADC, or the TDR system to place the TDR system in a cable disconnect mode, as well as a manual mode or a; self trigger mode, the controlling system including a controller and a state machine that are used to control operation for the TDR system.

17. A system, comprising:

a signal transmitting system that transmits signals into a cable;

a signal receiving system that receives return signals from the cable that correspond to the transmitted signals;

an analog-to-digital converter (ADC) that converts the return signals into digital signals;

a time domain reflectometry (TDR) system that receives the digital signals from the ADC and signals from a memory, wherein the TDR system uses the digital signals and the signals from the memory to determine whether the cable is in a connected without energy state, as well as whether the cable is connected or not connected; and a controlling system that controls the signal transmitting and receiving systems, the ADC, or the TDR system to place the TDR system in a cable disconnect mode, as well as a manual mode or a; self trigger mode, the controlling system including a controller and one or more state machines that are used to control operation for the TDR system.

* * * * *